Dec. 5, 1950 O. L. MacSORLEY 2,532,455
OSCILLATION GENERATOR
Filed April 23, 1947
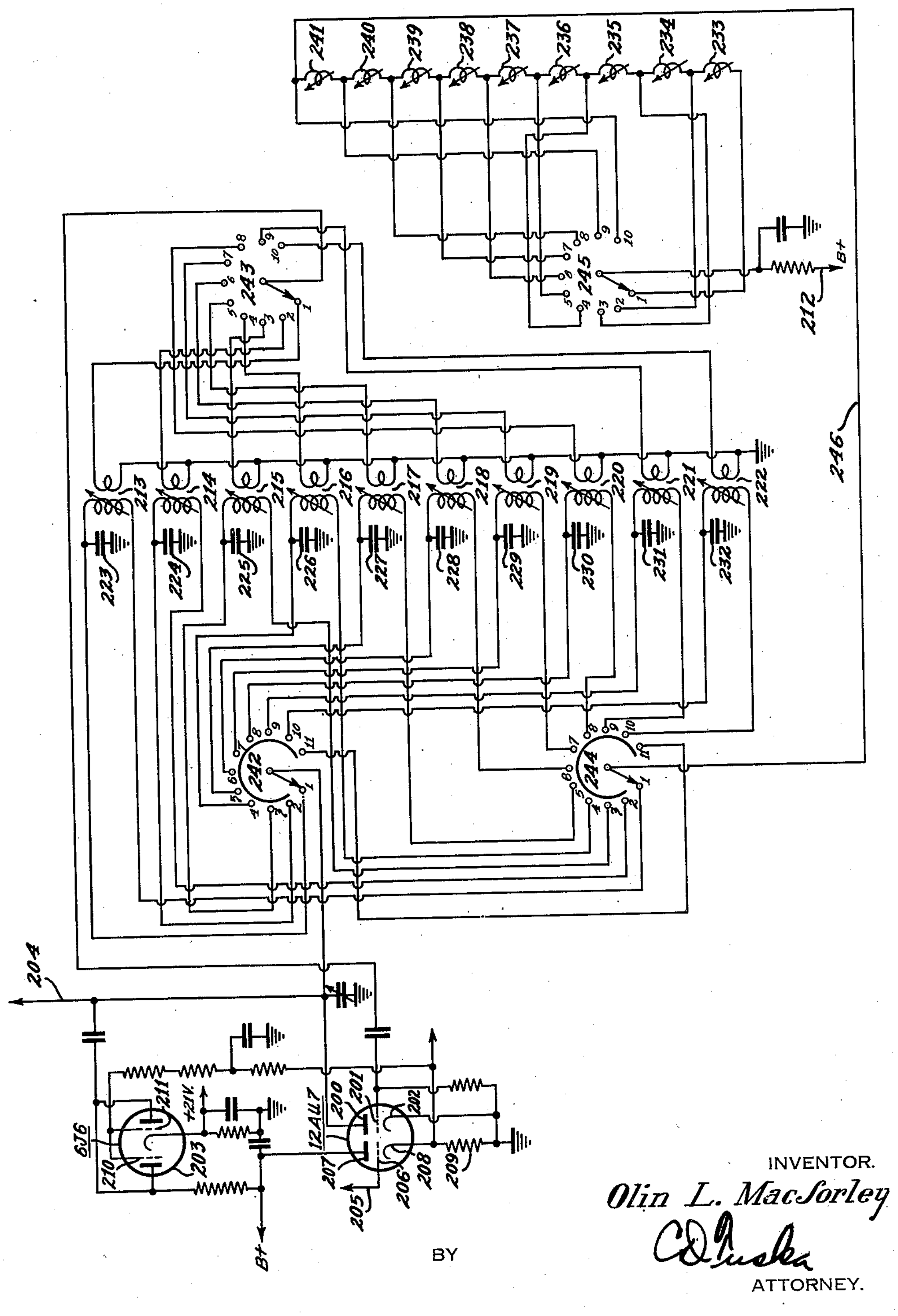
INVENTOR.
Olin L. MacSorley
BY
C. D. Tuska
ATTORNEY.

Patented Dec. 5, 1950 2,532,455

UNITED STATES PATENT OFFICE 2,532,455

OSCILLATION GENERATOR

Olin L. MacSorley, Collingswood, N. J., assignor to Radio Corporation of America, a corporation of Delaware Application April 23, 1947, Serial No. 743,266

1 Claim. (Cl. 250—36)

This invention relates to oscillation generators, and has for its principal object the provision of an improved oscillation generator and method of operation whereby an output frequency which is variable by equal steps over a considerable range of frequencies may be produced.

Such variation in frequency is accomplished by a control system which includes a switch arranged to connect in the circuit of the generator, one after another, a series of conventional oscillator coils by which the output frequency is changed by relatively large steps. For dividing each relatively large step into the desired number of relatively small steps, a second switch is arranged to connect in series with the operative oscillator coil such numbers of a plurality of series connected inductance coils as are required to produce the required number of frequency steps between the larger frequency steps.

Thus if the output frequency of the generator is to be varied over a range of 1195 kc. to 700 kc. by steps of 5 kc. for example, the first switch is operated to connect the 1195 kc. oscillator coil to the generator and the second switch is thereafter operated to increase one by one the number of inductance coils connected in series with the 1195 kc. oscillator coil. This operation is repeated with the 1145, 1095, 1045, 995, 945, 895, 845, 795, and 745 kc. oscillator coils. If the output frequency of the generator is to be increased by steps of 5 kc., the operation is reversed.

Important objects of the invention are the provision of an improved system for controlling the frequency of an oscillation generator; and the provision of an improved arrangement of switches, oscillator coils and inductance units whereby the output frequency of an oscillation generator may be changed by equal steps of 5 kc.

The invention will be better understood from the following description considered in connection with the accompanying drawing and its scope is indicated by the appended claim.

The single figure of the drawing is a wiring diagram of an oscillation generator arranged to have its output frequency controlled in accordance with the invention.

This figure shows an oscillator triode 200—201—202 which is interconnected with a reactance tube 203 in a conventional manner to deliver at an output terminal 204 oscillations of a frequency dependent on (1) the reactance of the tube 203, (2) the selected tuning coil connected to the anode 200 and (3) the number of inductance units connected in series with this selected coil.

The output frequency of the generator is established at the desired reference frequency by means of a potential applied through a lead 205 to the grid 206 of a cathode follower 206—207—

208 which is provided with a cathode lead resistor 209.

As is well known, the reactance across the oscillator tank circuit is thus established at a value dependent on the potential applied from the resistor 209 to the grids 210—211 of the reactance tube. This reactance is connected to the oscillator tank circuit in parallel with the selected tuning coil so that, if it is adjusted to a fixed value, the variation in the generator output frequency is produced by change in the tuning coil and in the inductance connected to a +B lead 240 in series with it.

The various oscillator coils beginning with the lowest frequency coil are indicated by the reference numerals 213 to 222. Connected in parallel with these oscillator coils are capacitors 223 to 232, respectively. The various inductance units are indicated by the reference numerals 233 to 241.

Selection of the various oscillator coils and inductance units is effected by four switches, 242, 243, 244 and 245. Switch 243 selectively connects the oscillator coils to the grid 201 of the triode 200—201—202. Switch 242 selectively connects the low voltage terminal of these coils to the anode 200 of the triode. Switch 244 selectively connects the high voltage terminal of the coils to a lead 246 of the inductance unit 241. Switch 245 selectively connects the inductance units 233 to 241 to the +B terminal 212.

It will be noted that switches 242 and 244 are each provided with eleven fixed contacts numbered from 1 to 11. Contacts 1 to 10 are used to connect the various tank coils into the circuit, while contacts 11, which are connected together, short the unused coils through the shorting rings. This is a customary procedure to eliminate undesirable effects from the unused coils. To obtain a frequency of 1195.0 kc. switches 242, 243 and 244 would be on contact 10 and switch 245 would be on contact 10.

To reduce this output frequency by 5 kc. steps, the movable contact of the switch 245 is moved to engage the fixed contacts 9 to 1 successively until the output frequency is reduced to 1150. When the movable contacts of the switches 242, 243 and 244 are moved to their number 9 positions and the movable contact of switch 245 is moved to number 10 position the +B lead 212 is connected directly to the high voltage terminal of the 1145 kc. oscillator coil 221 and this coil is connected through the switches 242 and 243 respectively to the anode 200 and the grid 201. This output frequency of 1145 is reduced by 5 kc. steps by operation of the switch 245 as explained in connection with the 1195 kc. oscillator coil 222. The same procedure is repeated with each of the oscillator coils 220 to 213. The switches 242, 243 and 244 may be ganged together for simultaneous operation.

The method by which the constants of the oscillator circuit are determined is as follows. It will be noted that for a particular frequency range and number of steps, any one coil or capacitor may be chosen arbitrarily, but that once this has been chosen, all others must bear a definite relation to this one. A convenient choice is the capacity of the highest frequency coil, which can be chosen as the minimum capacity desired in any tank circuit. The values of capacity calculated are total capacity including tube capacity and distributed capacity.

$$L_H=\frac{1}{4\pi^2F_H{}^2C_H}=\frac{1}{4\pi^2F_H{}^2C_H{}^2}$$

$L_H$=inductance in henrys of highest frequency coil (222).

$F_H$=resonant frequency in cycles of highest frequency tank circuit.

$C_H$=total capacity in farads in highest frequency tank circuit.

Next determine the total inductance $L_T$ of the nine coils 233 to 241 connected in series.

$$L_T=L_H\left[\left(\frac{F_H}{F_H-nF_s}\right)^2-1\right]$$

$n$=number of parts into which $L_T$ is divided.

$F_s$=cycles change produced by each change of switch 245.

The inductance of any of the other main coils may be calculated as follows:

$$\frac{L_C+L_T}{L_C}=\left[\frac{F_C}{F_C-nF_s}\right]^2=P$$

$$L_c=\frac{L_T}{P-1}$$

$L_C$=inductance of any coil 213 to 222 in henries.

$F_C$=maximum resonant frequency of circuit involving $L_C$ ($L_T$ completely out of circuit).

$$C_c=\frac{1}{4\pi^2F_c{}^2L_c}$$

$C_C$=total capacity in farads associated with $L_C$ including tube capacity, distributed capacity and fixed capacity such as one of 223 . . . 232.

To calculate the component parts of $L_T$ use the following formula.

$$L=\frac{1}{4\pi^2F^2C_c{}^1}=\frac{1}{4\pi^2F_c{}^2C_c{}^1}$$

$C_c{}^1$=the value of capacity previously calculated for one coil.

$F$ taken on the successive values $(F_C-F_S)$, $(F_C-2F_S)$, . . . $(F_C-nF_S)$ to give $L_{C1}$, $L_{C2}$, $L_{C3}$ . . . $L_{Cn}$ Then $$L_1=L_{C1}-L_C$$
$$L_2=L_{C2}-L_{C1}$$
$$L_3=L_{C3}-L_{C2}$$
$$L_n=L_{Cn}-L_{C(n-1)}$$
$$L_T=L_1+L_2+L_3+\ .\ .\ .\ +L_n$$

$L_1$ is coil 241

$L_2$ is coil 240

$L_n$ is coil 233

A typical group of values for operation over the range 700 to 1195 kc. in steps of 5 kc. is shown by the following tabulation. These are calculated on the basis of 68 mmf. capacity for the highest frequency circuit.

| Frequency ($F_c$) in megacycles | Coil No. | Inductance ($L_c$) in micro-henry | Capacitor No. | Total capacity $C_c$, in mmf. |
|---|---|---|---|---|
| 1,195 | 222 | 258 | 232 | 68.0 |
| 1,145 | 221 | 246 | 231 | 77.8 |
| 1,095 | 220 | 236 | 230 | 85.0 |
| 1,045 | 219 | 229 | 229 | 100.2 |
| 995 | 218 | 214 | 228 | 118.3 |
| 945 | 217 | 203 | 227 | 138.2 |
| 895 | 216 | 194 | 226 | 161.0 |
| 845 | 215 | 183 | 225 | 191.7 |
| 795 | 214 | 171 | 224 | 231.3 |
| 745 | 213 | 161 | 223 | 280.0 |

| Inductance No. | Inductance micro-henries |
|---|---|
| 241 | 2.0 |
| 240 | 2.0 |
| 239 | 2.1 |
| 238 | 2.1 |
| 237 | 2.1 |
| 236 | 2.2 |
| 235 | 2.2 |
| 234 | 2.3 |
| 233 | 2.3 |

It is to be understood, of course, that the values of the above tabulation apply to an oscillator tank circuit otherwise having the constants indicated by the legends adjacent its component parts and that a change in these component parts would involve recalculation of the tabulated values.

What the invention provides is an oscillator generator to provide a group of one hundred frequencies, having a fixed frequency difference between any two adjacent frequencies within a very small theoretical error. In the example given values were calculated for a range of 700 to 1195 kc. in 5 kc. steps. Had it been desired, this could just as readily have been 700 to 945 kc. in 2.5 kc. steps or 700 to 1245 kc. in 5.0 kc. steps.

I claim as my invention:

The combination of an oscillation generator having anode and grid circuits, a plurality of tuning units each including primary and secondary windings and each tuned to frequencies separated by equal and relatively wide steps, means for applying operating potential to said anode, circuit control means operable to successive closed positions for successively connecting each of said units to said oscillator so that said operating potential is applied to said anode through its primary winding and its secondary winding is connected in said grid circuit, a plurality of inductors having constants adapted to change the frequency of said generator by steps which are submultiples of said relatively wide steps, and circuit control means for selectively connecting different ones of said inductors between said operating potential applying means and said primary windings.

OLIN L. MACSORLEY.

REFERENCES CITED

The following references are of record in the file of this patent:

UNITED STATES PATENTS

| Number | Name | Date |
|---|---|---|
| 2,075,501 | Carlson | Mar. 30, 1937 |
| 2,192,205 | Siemens | Mar. 5, 1940 |
| 2,295,173 | Hoffmann | Sept. 8, 1942 |
| 2,297,889 | Hoffmann | Oct. 6, 1942 |
| 2,354,148 | Shaw | July 18, 1944 |
| 2,438,474 | Dodds et al. | Mar. 23, 1948 |